(12) United States Patent
Morgan et al.

(10) Patent No.: US 8,044,594 B2
(45) Date of Patent: Oct. 25, 2011

(54) POWER SUPPLY IGNITION SYSTEM AND METHOD

(75) Inventors: Forrest Morgan, Masonville, CO (US); Daryl Frost, Windsor, CO (US); Frank Heine, Fort Collins, CO (US); Doug Pelleymounter, Northfield, MN (US); Hendrik Walde, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 393 days.

(21) Appl. No.: 12/424,138

(22) Filed: Apr. 15, 2009

(65) Prior Publication Data

US 2010/0026186 A1 Feb. 4, 2010

Related U.S. Application Data

(60) Provisional application No. 61/085,392, filed on Jul. 31, 2008.

(51) Int. Cl.
*H01J 7/24* (2006.01)
(52) U.S. Cl. .................................. 315/111.21
(58) Field of Classification Search .............. 315/111.21
See application file for complete search history.

(56) References Cited

U.S. PATENT DOCUMENTS

| | | | |
|---|---|---|---|
| 3,867,669 A | 2/1975 | Krasik et al. | |
| 4,271,369 A | 6/1981 | Stillwagon | |
| 4,276,507 A | 6/1981 | Stillwagon | |
| 4,299,678 A | 11/1981 | Meckel | |
| 4,428,023 A | 1/1984 | Maier | |
| 4,459,629 A | 7/1984 | Titus | |
| 4,484,243 A | 11/1984 | Herbst et al. | |
| 4,540,607 A | 9/1985 | Tsao | |
| 4,557,819 A | 12/1985 | Meacham et al. | |
| 4,585,986 A | 4/1986 | Dyer | |
| 4,589,123 A | 5/1986 | Pearlman et al. | |
| 4,740,858 A | 4/1988 | Yamaguchi et al. | |

(Continued)

FOREIGN PATENT DOCUMENTS

WO WO2006014212 A2 2/2006

(Continued)

OTHER PUBLICATIONS

Young, Lee W., "PCT International Search Report re Application No. PCT/US08/054056", Jun. 25, 2008, Published in: PCT.

(Continued)

*Primary Examiner* — Jacob Y Choi
*Assistant Examiner* — Anthony Arpin
(74) *Attorney, Agent, or Firm* — Neugeboren O'Dowd PC

(57) ABSTRACT

One embodiment comprises a plasma processing system having a plasma chamber, a generator, a feedback component, and a controller. The feedback component is adapted to receive at least one first signal having a level dependent upon the power signal supplied from the generator to the chamber. A feedback output is adapted to emit a second signal to the controller, which is adapted to supply a third signal to the power generator. The third signal is configured to control the power generator to supply the power signal at a power level for a particular processing application. The power generator is further controlled by the controller to one of reduce and remove power from the plasma processing chamber and subsequently increase the voltage level until the power level reaches a threshold level. The power generator is further controlled to subsequently modulate the voltage until the voltage returns to a first voltage level.

19 Claims, 3 Drawing Sheets

U.S. PATENT DOCUMENTS

| | | | |
|---|---|---|---|
| 4,792,730 A | 12/1988 | Mintchev et al. | |
| 4,870,529 A | 9/1989 | Powell et al. | |
| 4,871,421 A | 10/1989 | Ogle et al. | |
| 4,901,621 A | 2/1990 | Tidman | |
| 4,936,960 A * | 6/1990 | Siefkes et al. | 204/192.38 |
| 4,999,760 A | 3/1991 | Tietema | |
| 5,192,894 A | 3/1993 | Teschner | |
| 5,241,152 A | 8/1993 | Anderson et al. | |
| 5,275,083 A | 1/1994 | Hawke et al. | |
| 5,281,321 A | 1/1994 | Sturmer et al. | |
| 5,286,360 A | 2/1994 | Szczyrbowski | |
| 5,303,139 A | 4/1994 | Mark | |
| 5,307,004 A | 4/1994 | Carsten | |
| 5,377,218 A | 12/1994 | Guenther | |
| 5,415,757 A | 5/1995 | Szczyrbowski et al. | |
| 5,418,707 A | 5/1995 | Shimer et al. | |
| 5,427,669 A | 6/1995 | Drummond | |
| 5,488,535 A | 1/1996 | Masghati et al. | |
| 5,517,085 A | 5/1996 | Engemann et al. | |
| 5,535,906 A | 7/1996 | Drummond | |
| 5,576,939 A | 11/1996 | Drummond | |
| 5,584,972 A | 12/1996 | Lantsman | |
| 5,584,974 A | 12/1996 | Sellers | |
| 5,616,224 A | 4/1997 | Boling | |
| 5,645,698 A | 7/1997 | Okano | |
| 5,651,865 A | 7/1997 | Sellers | |
| 5,682,067 A | 10/1997 | Manley et al. | |
| 5,698,082 A | 12/1997 | Teschner et al. | |
| 5,708,250 A | 1/1998 | Benjamin et al. | |
| 5,718,813 A | 2/1998 | Drummond et al. | |
| 5,725,675 A | 3/1998 | Fong et al. | |
| 5,731,565 A | 3/1998 | Gates | |
| 5,750,971 A | 5/1998 | Taylor | |
| 5,814,195 A | 9/1998 | Lehan et al. | |
| 5,815,388 A | 9/1998 | Manley et al. | |
| 5,851,365 A | 12/1998 | Scobey | |
| 5,855,745 A | 1/1999 | Manley | |
| 5,882,492 A | 3/1999 | Manley et al. | |
| 5,917,286 A | 6/1999 | Scholl et al. | |
| 6,001,224 A | 12/1999 | Drummond | |
| 6,005,218 A | 12/1999 | Walde et al. | |
| 6,024,844 A | 2/2000 | Drummond et al. | |
| 6,046,641 A | 4/2000 | Chawla | |
| 6,080,292 A | 6/2000 | Matsuzawa et al. | |
| 6,135,998 A | 10/2000 | Palanker | |
| 6,161,332 A | 12/2000 | Avot | |
| 6,162,332 A | 12/2000 | Chiu | |
| 6,174,450 B1 | 1/2001 | Patrick et al. | |
| 6,176,979 B1 | 1/2001 | Signer et al. | |
| 6,222,321 B1 | 4/2001 | Scholl et al. | |
| 6,238,513 B1 | 5/2001 | Arnold et al. | |
| 6,321,531 B1 | 11/2001 | Caren et al. | |
| 6,365,009 B1 | 4/2002 | Ishibashi | |
| 6,416,638 B1 | 7/2002 | Kuriyama et al. | |
| 6,433,987 B1 | 8/2002 | Liptak | |
| 6,440,281 B1 | 8/2002 | Sturmer | |
| 6,447,655 B2 | 9/2002 | Lantsman | |
| 6,447,719 B1 | 9/2002 | Agamohamadi et al. | |
| 6,472,822 B1 | 10/2002 | Chen et al. | |
| 6,484,707 B1 | 11/2002 | Frus et al. | |
| 6,507,155 B1 | 1/2003 | Barnes et al. | |
| 6,522,076 B2 | 2/2003 | Goedicke et al. | |
| 6,524,455 B1 | 2/2003 | Sellers | |
| 6,552,295 B2 | 4/2003 | Markunas et al. | |
| 6,621,674 B1 * | 9/2003 | Zahringer et al. | 361/58 |
| 6,636,545 B2 | 10/2003 | Krasnov | |
| 6,736,944 B2 | 5/2004 | Buda | |
| 6,817,388 B2 | 11/2004 | Tsangaris | |
| 6,878,248 B2 | 4/2005 | Signer et al. | |
| 6,943,317 B1 * | 9/2005 | Ilic et al. | 219/121.57 |
| 6,967,305 B2 | 11/2005 | Sellers | |
| 7,081,598 B2 * | 7/2006 | Ilic et al. | 219/121.59 |
| 7,169,256 B2 | 1/2007 | Dhindsa et al. | |
| 7,179,987 B2 | 2/2007 | Farth et al. | |
| 7,247,218 B2 | 7/2007 | Hoffman | |
| 7,305,311 B2 | 12/2007 | Van Zyl | |
| 7,345,428 B2 * | 3/2008 | Turner | 315/111.21 |
| 7,445,695 B2 * | 11/2008 | Ilic et al. | 204/192.12 |
| 7,471,047 B2 | 12/2008 | Ogawa | |
| 7,498,908 B2 | 3/2009 | Gurov | |
| 7,503,996 B2 | 3/2009 | Chen et al. | |
| 7,514,935 B2 | 4/2009 | Pankratz | |
| 7,615,931 B2 * | 11/2009 | Hooke et al. | 315/111.21 |
| 7,651,492 B2 | 1/2010 | Wham | |
| 2002/0170678 A1 | 11/2002 | Hayashi et al. | |
| 2003/0192475 A1 | 10/2003 | Shannon et al. | |
| 2003/0205460 A1 * | 11/2003 | Buda | 204/192.13 |
| 2003/0205557 A1 | 11/2003 | Benjamin et al. | |
| 2004/0026235 A1 | 2/2004 | Stowell, Jr. | |
| 2004/0027209 A1 | 2/2004 | Chen et al. | |
| 2004/0182697 A1 | 9/2004 | Buda | |
| 2004/0191950 A1 | 9/2004 | Nakamura et al. | |
| 2004/0226657 A1 | 11/2004 | Hoffman | |
| 2004/0245999 A1 * | 12/2004 | Walde et al. | 324/536 |
| 2005/0035770 A1 | 2/2005 | Hopkins et al. | |
| 2005/0040144 A1 | 2/2005 | Sellers | |
| 2005/0092596 A1 | 5/2005 | Kouznetsov | |
| 2005/0258148 A1 | 11/2005 | Condrashoff | |
| 2005/0264218 A1 | 12/2005 | Dhindsa et al. | |
| 2006/0011591 A1 | 1/2006 | Sellers | |
| 2006/0049831 A1 | 3/2006 | Anwar et al. | |
| 2006/0054601 A1 | 3/2006 | Ilic et al. | |
| 2006/0057854 A1 | 3/2006 | Setsuhara et al. | |
| 2006/0066248 A1 | 3/2006 | Chistyakov | |
| 2006/0189168 A1 | 8/2006 | Sato et al. | |
| 2006/0214599 A1 | 9/2006 | Ogawa | |
| 2006/0241879 A1 | 10/2006 | Van Zyl | |
| 2006/0252283 A1 | 11/2006 | Takeda et al. | |
| 2006/0278608 A1 | 12/2006 | Hoffman | |
| 2007/0008034 A1 | 1/2007 | Tayrani | |
| 2007/0042131 A1 | 2/2007 | Soo et al. | |
| 2007/0080903 A1 | 4/2007 | Lee | |
| 2007/0139122 A1 | 6/2007 | Nagarkatti et al. | |
| 2008/0061794 A1 | 3/2008 | Pankratz | |
| 2008/0122369 A1 | 5/2008 | Nitschke | |
| 2008/0156632 A1 | 7/2008 | Van Zyl | |
| 2008/0203070 A1 | 8/2008 | Illic et al. | |
| 2009/0206822 A1 * | 8/2009 | Coumou | 324/76.14 |
| 2010/0026186 A1 | 2/2010 | Forest et al. | |
| 2011/0011730 A1 * | 1/2011 | Valcore et al. | 204/192.1 |

FOREIGN PATENT DOCUMENTS

| | | | |
|---|---|---|---|
| WO | WO2006023847 A1 | 3/2006 | |
| WO | WO2008033968 A2 | 3/2008 | |

OTHER PUBLICATIONS

Kolev, Vesselin, "PCT International Search Report re Application No. PCT/US09/066899", Feb. 19, 2010, Published in: PCT.

Kim, Ki Wan, "PCT International Search Report re Application No. PCT/US09/051174", Feb. 24, 2010, Publisher: PCT, Published in: PCT.

* cited by examiner

POWER SUPPLY IGNITION SYSTEM AND METHOD

PRIORITY

This application claims the benefit of Provisional U.S. Patent Application No. 61/085,392 filed on Jul. 31, 2008. The details of Application No. 61/085,392 are incorporated by reference into the present application in its entirety and for all proper purposes.

FIELD OF THE INVENTION

The present invention generally relates to a plasma processing environment. In particular, but not by way of limitation, embodiments of the present invention relate to a system and method for controlling the application of voltage and power to a plasma chamber.

BACKGROUND OF THE INVENTION

In order for plasma to form in a plasma chamber during the creation of thin film or other applications, a power generator often creates an electric potential between a cathode and anode within the plasma chamber. This causes ignition of a processing gas into the plasma. The plasma then acts upon the cathode to create the thin film upon a substrate within the chamber.

Although the creation of plasma through the use of a potential between a cathode and an anode enables creation of the thin film or other application, using a cathode and anode in such a manner often creates electrical discharges or arcs. Arcing can occur through other methods as well. An electric arc is an electrical breakdown of a gas which produces an ongoing plasma discharge. Arc discharges are undesirable because they can create non-uniformities in the thin film coating, thereby lowering the quality of the processed film.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

One embodiment of the invention comprises a plasma processing system. One plasma processing system comprises a plasma chamber, a power generator, a feedback component, and a controller. One power generator comprises an output adapted to supply a power signal to the plasma chamber. One feedback component comprises (i) at least one input adapted to receive at least one first signal having a first signal level dependent upon the power signal and (ii) an output adapted to emit a second signal having a second signal level. One controller is adapted to receive the second signal and supply a third signal to the power generator, the third signal (i) having a third signal level dependent upon the second signal level, and (ii) configured to control the power generator to (a) apply the power signal at a power level comprising a first power level and a first voltage level for a particular processing application, (b) one of reduce and remove power from the processing chamber, (c) after the power is one of reduced and removed, increase the voltage level until the power level reaches a threshold level, and (d) after the threshold level is reached, modulate the voltage until the voltage level returns to the first voltage level.

Another embodiment of the invention comprises a method of supplying power to a plasma chamber. One method comprises applying voltage from a power generator to a plasma chamber at a first voltage level corresponding to a first power level and storing the first power level in a memory device. The voltage is then reduced from the first voltage level to a second voltage level corresponding to a second power level. Voltage is then increased to a new voltage level. A new power level corresponding to the new voltage level is then measured. It is then determined whether the measured power level is less than a threshold power level. In one embodiment, the threshold power level comprises the first power level. When the measured power level is not less than the threshold power level, the voltage is modulated until the voltage level returns to the first voltage level. When the measured power level is less than the threshold power level, the voltage is increased to a higher voltage level corresponding to a higher new power level.

Yet another embodiment of the invention comprises a power supply for applying power to a plasma processing chamber. One power supply comprises a power generator configured to generate the power applied to the plasma processing chamber, a feedback component comprising at least one of hardware, firmware, and software configured to provide a signal indicative of a power level that the power generator applies to the plasma chamber, and a controller comprising at least one of hardware, firmware, and software configured to control the power generator. The power generator is controlled to (i) apply power at a particular power level and a particular voltage for a particular processing application, (ii) reduce or remove the power from the plasma processing chamber, (iii) increase, subsequent to the power being reduced or removed, a voltage level applied to the plasma chamber until the power reaches a threshold level, and (iv) modulate, subsequent to the threshold level being reached, the voltage until the voltage level returns to the particular voltage level again.

These and other embodiments are described in further detail herein.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings, wherein:

DETAILED DESCRIPTION

Figure 1:
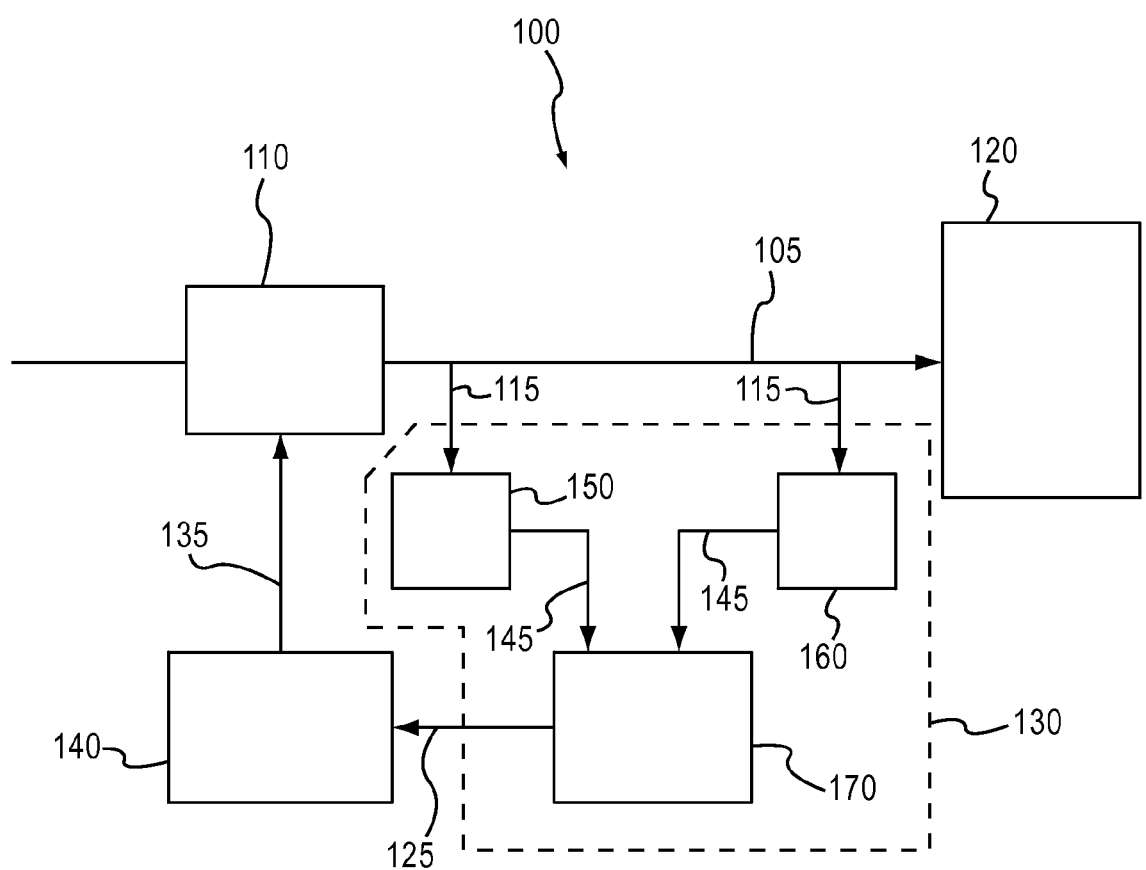
FIG. 1 is a functional block diagram of a portion of a plasma processing system in accordance with an illustrative embodiment of the invention.

Referring now to the drawings, where like or similar elements are designated with identical reference numerals throughout the several views where appropriate, and referring in particular to FIG. 1, shown is a functional block diagram of a portion of a plasma processing system 100 in accordance with an illustrative embodiment of the invention. The portion of the plasma processing system 100 shown in FIG. 1 comprises a power generator 110, a plasma chamber 120, a feedback component 130, and a controller 140.

The feedback component 130 in one embodiment is comprised of at least one input and an output. The at least one input is adapted to receive at least one first signal 115 and the output is adapted to emit a second signal 125. The controller 140 is adapted to receive the second signal 125 and provide a third signal 135 to the power generator 110.

One power generator 110 may be comprised of a low frequency generator, a mid-frequency generator, a DC generator, or a radio frequency (RF) generator. Furthermore, the power generator 110 comprises an output electronically coupled to and adapted to provide power to the plasma chamber 120. The power generator 110 generally provides power to the plasma chamber 120 via a power signal 105 adapted to ignite and sustain a plasma in the chamber 120 for plasma processing (e.g., reactive or non-reactive plasma processing). Although not required, in many embodiments the generator 110 may be configured to operate in a frequency range between 33 kHz and 100 kHz. By way of further example, one generator 110 may be comprised of a CRYSTAL model generator, which is available from Advanced Energy Incorporated in Fort Collins, Colo.

In one embodiment, the power signal 105 is comprised of a power signal level corresponding to an amount of power being supplied to the plasma chamber. Furthermore, the at least one first signal 115 may be comprised of two signals, each first signal comprising a first signal level dependent upon the power signal level. One first signal may be adapted to be received by a current sensor 150 and the other first signal may be adapted to be received by a voltage sensor 160. Although not depicted in FIG. 1, one of ordinary skill in the art will readily appreciate that the sensors 150, 160 may include a transducer, electronics, and processing logic (e.g., instructions embodied in software, hardware, firmware or a combination thereof).

The current and voltage sensors 150, 160 may be adapted to output a fourth signal 145. The fourth signal 145 may be digital or analog. For example, the current sensor 150 may output a fourth signal 145 comprising a current level of the power signal 105, while the voltage sensor 160 may output a fourth signal 145 comprising a voltage level of the power signal 105. The one or more fourth signals 145 may be received by a multiplier 170 adapted to provide the second signal 125 to the controller 140. One second signal 125 may comprise a signal indicative of the power signal level that is sent to the plasma chamber 120 by the generator 110.

Figure 3A:
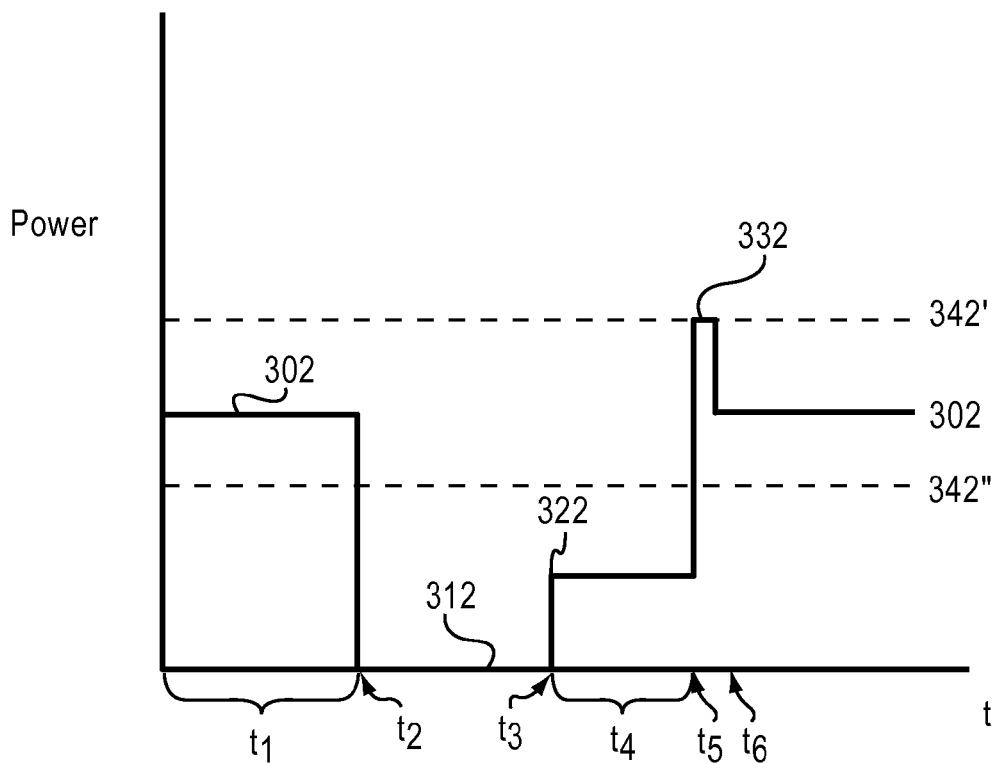
FIG. 3A is a graph displaying a power generator power level output as a function of time in accordance with an illustrative embodiment of the invention.
Figure 3B:
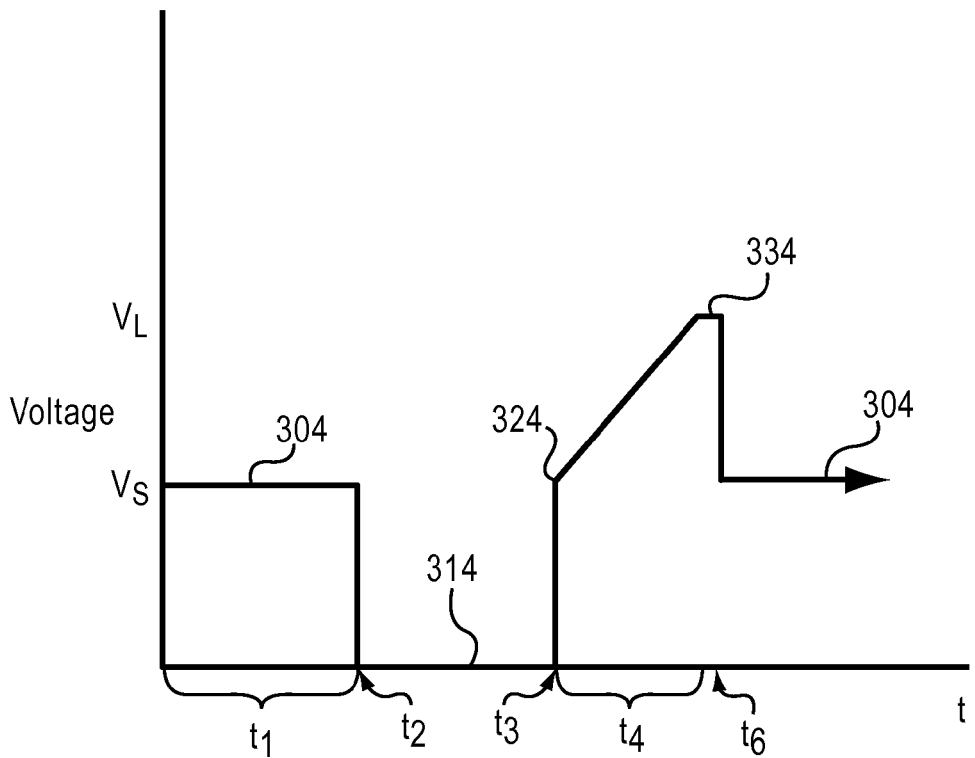
FIG. 3B is a graph displaying a power generator voltage level output as a function of time in accordance with an illustrative embodiment of the invention.

The third signal 135 in one embodiment is a control signal dependent upon a second signal level. The third signal 135 may be configured to control the power generator 110. For example, one third signal is configured to control the power generator 110 to apply the power signal 105 at a power level comprising a first power level 302 and a first voltage level 304 (as shown in FIGS. 3A & 3B) to the plasma chamber 120 for a particular processing application such as, but not limited to, creating a film on a glass substrate. The power generator 110 may be configured to then one of reduce and remove the power from the processing chamber 120 and subsequent to the one of reducing and removing power, increasing voltage until the power reaches a threshold level at which point voltage is modulated until voltage returns to the first voltage level 304.

The illustrated arrangement of the components in FIG. 1 is logical and not meant to be an actual hardware diagram; thus, the components can be combined or further separated in an actual implementation. For example, the functionality of one or both of the sensors 150, 160 may be implemented with components of the multiplier 170 and/or the controller 140. Additionally, one or more of the sensors 150, 160, multiplier 170, and the controller 140 may be entirely contained within a housing of the generator 110. Such an embodiment may comprise a plasma power adjustment device. Moreover, it should be recognized that the components included in FIG. 1 depict an exemplary implementation, and in other embodiments, some components may be omitted and/or other components added.

In some embodiments for example, a matching network may be disposed between the generator 110 and the chamber 120 to transform a chamber impedance (which can vary with the frequency of the applied voltage, a chamber pressure, the composition of the gas within the chamber 120, and the target or substrate material contained within the chamber 120) to an ideal load for the power generator 110. Furthermore, it is contemplated that at least one of the feedback component 130 and the controller 140 may be comprised of software, firmware, hardware, and/or a combination of one or more.

In several embodiments, the system depicted in FIG. 1 includes arc detection and arc management components to detect and abate arcing that may occur during processing. The controller 140, for example, may be comprised of a processor adapted to use the second signal 125 in detecting an arc in the chamber 120 and subsequently initiating an arc management response to the generator 110 in order to extinguish the arc. U.S. patent application Ser. No. 11/873,403, entitled Arc Detection and Handling in Radio Frequency Power Applications, and U.S. application Ser. No. 11/531,599, entitled System and Method for Managing Power Supplied to a Plasma Chamber, provide additional details relative to arc management functionality.

Figure 2:
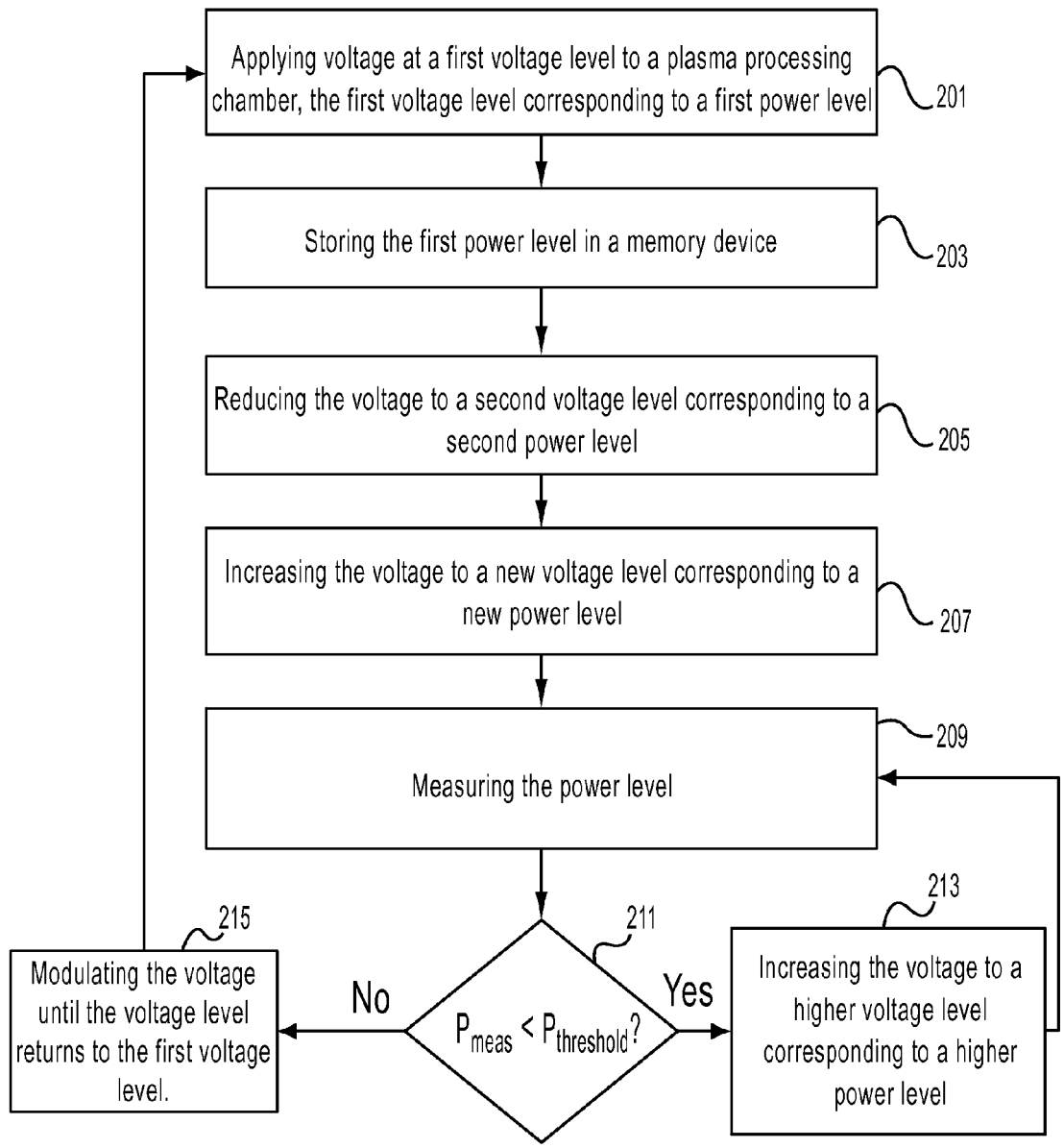
FIG. 2 is a flow chart comprising a method of supplying power to a plasma chamber in accordance with an illustrated embodiment of the invention.

Referring next to FIG. 2, shown is a flowchart depicting an exemplary method of supplying power to the plasma chamber 120 that may be carried out while utilizing the system 100 depicted in FIG. 1. As depicted at 201, the power generator 110 applies voltage at a first voltage level 304 corresponding to a first power level 302 to the plasma processing chamber 120. In many embodiments, the first power and first voltage levels 302, 304 are selected to achieve a desired processing result. In the context of glass coating, for example, the power and voltage levels may be selected so that a target material is deposited on a glass substrate so as to produce a clear film on the glass substrate at a relatively high rate of deposition (this mode of operation is often referred to as a transition region of operation). Referring to FIGS. 3A and 3B, which depict exemplary power and voltage characteristics that may be experienced by the system depicted in FIG. 1 undergoing the method depicted in FIG. 2, shown are a first power level 302 and a first voltage level 304 operating during a first period of time $t_1$.

Referring now to FIGS. 2-3B, at 203 the first power level 302 is stored in a memory device (e.g., memory, not shown, that may be coupled to the controller 140 or another component) before, at 205, voltage to the plasma chamber 120 is subsequently reduced or removed at time $t_2$ to a second voltage level 314 corresponding to a second power level 312. In many embodiments for example, the voltage applied to the plasma chamber 120 is reduced or removed in response to an arc that is detected within the chamber 120. Voltage to the chamber 120 may also be reduced or removed for other reasons such as, but not limited to, routine system maintenance.

At 207, a new voltage level 324 corresponding to a new power level 322 is applied to the chamber 120 at time $t_3$ (e.g., after an arc is extinguished). The new power level 322 that is applied to the plasma chamber 120 is then measured at 209 and compared at 211 to a threshold power level 342', 342". As seen in FIG. 3A, the threshold power level may be greater than the first power level, as shown by reference numeral 342', or less than the first power level, as shown by reference numeral 342". In one embodiment, when it is determined that the measured power level is less than the threshold power level 342', 342", the voltage is increased at 213 during time $t_4$. In one embodiment, the voltage may be increased to a voltage limit for the generator 110. At time $t_5$, the method returns to step 209 where the power level is measured and at 211 it is determined whether the power is at least as great as the threshold power level 342' 342". It is to be appreciated that the increase and decrease in voltage and power levels in FIGS. 3A and 3B during times $t_4$ and elsewhere are only meant to be representative and actual rates of increase of the voltage and power levels may vary substantially.

In one embodiment, when the measured power level (e.g., power levels 322 and 332) is not less than the threshold power level 342' 342", the voltage is modulated until the voltage level returns to the first voltage level 304. For example, at time $t_6$, the voltage may be decreased to the first voltage level 304 in order for the power to return to the first power level 302, at which time the method returns to step 201.

As shown in FIGS. 3A & 3B, the threshold power level 342 may be greater than or less than the first power level 302. One threshold level 342 comprises a power level adapted to ignite the plasma. As shown in FIG. 3A, one threshold power level 342" may be about 75% of the first power level 302 or the threshold power level 342' may be about 125% of the first power level 302. The threshold level 342 varies depending upon preference or other engineering considerations. The threshold power level 342 may also be substantially equal to the first power level 302 in one embodiment.

The threshold power level 342 may comprise a plasma ignition power level. Therefore, in one embodiment, the plasma may ignite at a power level lower or higher than the first power level 302. In such an embodiment(s), the voltage is modulated, subsequent to ignition, towards a voltage level corresponding to the first power level 302. One voltage level may be the first voltage level 304.

As one of ordinary skill in the art will appreciate, before plasma in the chamber 120 is ignited, the current drawn by the chamber 120 in one embodiment may be low; thus, if power level 322 is lower than the designated threshold level 342, the controller 140 may determine that the plasma has not ignited. As a consequence, in response to the second signal 125, the controller 140 may provide a third signal 135 to the power generator 110 which increases the voltage to voltage level 334 adapted to overcome the generator impedance. As shown in FIGS. 3A & 3B, as the voltage is incrementally increased, the power may perform a step increase upon a decrease in the chamber impedance.

It should be recognized that unlike prior approaches that employ one or more strike voltages (e.g., short voltage pulse(s)) to reignite the plasma, several embodiments of the present invention increase the voltage that is applied to the chamber 120 in a controlled manner which utilizes the power level in regulating the application of the voltage. As a consequence, unlike the application of an aggressive strike voltage that is prone to initiating an arc (and potentially an "arc-ignition loop"), these embodiments provide a more controlled recovery (e.g., from an arcing event) that is less prone to plasma instability problems.

In conclusion, the present invention provides, among other things, a system and method for controlling the application of voltage and power to a plasma chamber 120 during ignition of the plasma. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in this disclosure.

What is claimed is:

1. A plasma processing system comprising,
a plasma chamber;
a power generator comprising an output adapted to supply a power signal to the plasma chamber;
a feedback component comprising,
at least one input, each of the at least one inputs adapted to receive at least one first signal having a first signal level dependent upon the power signal, and
an output adapted to emit a second signal having a second signal level; and
a controller adapted to,
receive the second signal, and
supply a third signal to the power generator, the third signal,
having a third signal level dependent upon the second signal level, and
configured to control the power generator to,
supply the power signal at a power level comprising a first power level and a first voltage level for a particular processing application,
one of reduce and remove the power from the plasma processing chamber,
increase, subsequent to the power being one of reduced and removed, the voltage level until the power level reaches a threshold level, and
modulate, subsequent to the threshold level being reached, the voltage until the voltage level returns to the first voltage level.

2. The system of claim 1 wherein, the feedback component and the controller comprise at least one of hardware, software, and firmware.

3. The system of claim 1 wherein,
at least one of the feedback component and the controller further comprise a memory device;
the power signal level is adapted to be stored in the memory device;
the controller is adapted to determine from the second signal at least one of (i) the power signal level, and (ii) whether an arc event has occurred in the plasma chamber; and
the third signal is adapted to extinguish an arc.

4. The system of claim 1 wherein, the power generator is further adapted to one of apply, reduce, and remove power to the plasma chamber in response to the third signal level.

5. The system of claim 1 wherein, the feedback component comprises,
at least one sensor coupled to the power generator output; and
a multiplier.

6. The system of claim 5 wherein, the multiplier is adapted to emit the second signal.

7. The system of claim 5 wherein, the at least one sensor is adapted to,
   receive the least one first signal; and
   emit an at least one fourth signal to the multiplier.
8. The system of claim 7 wherein,
   the at least one sensor comprises,
      a current sensor, and
      a voltage sensor; and
   the at least one fourth signal comprises a current signal and a voltage signal
9. A method of supplying power to a plasma chamber comprising,
   applying voltage at a first voltage level from a power generator to a plasma chamber, the first voltage level corresponding to a first power level;
   storing the first power level in a memory device;
   reducing the voltage applied to the plasma chamber from the first voltage level to a second voltage level corresponding to a second power level;
   increasing the voltage to a new voltage level;
   measuring a new power level corresponding to the new voltage level;
   determining whether the measured power level is less than a threshold power level;
   one of (i) increasing the voltage from the measured voltage level to higher voltage level when the measured power level is less than the threshold power level, and (ii) modulating the voltage until the voltage level returns to the first voltage level when the measured power level is not less than the threshold power level.
10. The method of claim 9 wherein, determining whether the measured power level is less than the stored power level comprises initiating a loop comprising,
   the increasing the voltage from the measured voltage level to another new voltage level when the measured power level is less than the stored power level, the new voltage level corresponding to a new power level;
   measuring the another new power level;
   determining whether the another new power level is less than the stored power level; and
   repeating the first loop when the another new power level is less than the stored power level.
11. The method of claim 9 wherein,
   the threshold power level comprises the first power level; and
   the new power level comprises a power level at least as great as a threshold power level adapted to ignite a plasma in the plasma chamber.
12. The method of claim 11 wherein, the threshold power level comprises a power level one of greater than and equal to seventy-five percent of the first power level.
13. The method of claim 9, further including,
   adjusting the voltage to a final voltage level; and
   storing the final voltage in a memory device.
14. The method of claim 13 wherein, the final voltage level substantially equals the first voltage level.
15. The method of claim 9 wherein, the power is reduced from the first power level to the second power level upon detecting an arc in the plasma chamber.
16. The method of claim 15 wherein detecting an arc in the plasma chamber comprises,
   providing a current signal to a multiplier, the current signal comprising a current level applied by the power generator to the plasma chamber;
   providing a voltage signal to the multiplier, the voltage signal comprising a voltage level applied by the power generator to the plasma chamber; and
   providing a second signal from a multiplier to a controller, the second signal comprising a power level applied by the power generator to the plasma chamber.
17. A power supply for applying power to a plasma processing chamber, the power supply comprising:
   a power generator configured to generate the power applied to the plasma processing chamber;
   a feedback component comprising at least one of hardware, firmware, and software configured to provide a signal indicative of a power level that the power generator applies to the plasma chamber; and
   a controller comprising at least one of hardware, firmware, and software configured to control the power generator to,
      apply power at a particular power level and a particular voltage level for a particular processing application,
      reduce or remove the power from the plasma processing chamber,
      increase, subsequent to the power being reduced or removed, the voltage level applied to the plasma chamber until the voltage level reaches a threshold level, and
      modulate, subsequent to the threshold level being reached, the voltage until the voltage level returns to the particular voltage level again.
18. The power supply of claim 17 wherein, the controller is adapted to detect an arc.
19. The power supply of claim 18 wherein, the controller is further adapted to abate the arc.

* * * * *